US007748494B2

(12) United States Patent
Leclear et al.

(10) Patent No.: US 7,748,494 B2
(45) Date of Patent: Jul. 6, 2010

(54) ACOUSTIC CHAMBER AS PART OF ADAPTER

(75) Inventors: Douglas D. Leclear, Coloma, MI (US); Ruben E. Rothermel, Berrien Springs, MI (US); Andrew M. Tenbarge, Saint Joseph, MI (US); James W. Kendall, Stevensville, MI (US); Richard A. McCoy, Stevensville, MI (US)

(73) Assignee: Whirlpool Corporation, Benton Harbor, MI (US)

(*) Notice: Subject to any disclaimer, the term of this patent is extended or adjusted under 35 U.S.C. 154(b) by 0 days.

(21) Appl. No.: 12/117,107

(22) Filed: May 8, 2008

(65) Prior Publication Data

US 2008/0202844 A1 Aug. 28, 2008

Related U.S. Application Data

(63) Continuation of application No. 11/650,222, filed on Jan. 4, 2007.

(51) Int. Cl.
*H05K 5/02* (2006.01)
*H04R 1/02* (2006.01)
*H05K 5/00* (2006.01)

(52) U.S. Cl. ....................... 181/150; 181/148; 181/199; 381/333; 381/388; 381/301; 312/401

(58) Field of Classification Search ................. 181/150, 181/156, 148, 199; 381/333, 388, 332, 334, 381/301, 386; 361/724–728, 731, 733; 439/300, 439/676; 62/531; 312/405, 237, 401, 402, 312/404, 407.1
See application file for complete search history.

(56) References Cited

U.S. PATENT DOCUMENTS

| | | | |
|---|---|---|---|
| 2,795,639 | A | 6/1957 | Rawson |
| 3,054,024 | A | 9/1962 | Van Dillen et al. |
| 3,836,221 | A | 9/1974 | Whistler, Jr. |
| 3,858,091 | A | 12/1974 | Wilkinson |
| D273,836 | S | 5/1984 | Ohyama et al. |
| 4,546,267 | A | 10/1985 | Urfiner |
| 4,628,351 | A | 12/1986 | Heo |
| 4,691,195 | A | 9/1987 | Sigelman et al. |
| 4,718,740 | A | 1/1988 | Cox |
| 4,773,032 | A | 9/1988 | Uehara et al. |

(Continued)

FOREIGN PATENT DOCUMENTS

CN 1683856 10/2005

(Continued)

OTHER PUBLICATIONS

Article Entitled "Johnson Controls All-New Overhead Rail System Debuts in Ford F-150 Pickup Truck At North American International Auto Show"—www.prnewswire.com (2 Pages).

(Continued)

*Primary Examiner*—Edgardo San Martin
(74) *Attorney, Agent, or Firm*—Robert A. Bacon; McGarry Bair PC

(57) ABSTRACT

An acoustic chamber as part of adapter for an appliance. The acoustic chamber is substantially enclosed except at the exterior surface, and is configured to interchangeably receive a plurality of different consumer electronic devices.

30 Claims, 10 Drawing Sheets

U.S. PATENT DOCUMENTS 4,814,759 A 3/1989 Gombrich et al.
4,884,626 A 12/1989 Filipowski
4,969,830 A 11/1990 Daly et al.
5,173,686 A 12/1992 Fujihara
5,187,744 A 2/1993 Richter
5,235,822 A 8/1993 Leonovich, Jr.
5,281,018 A 1/1994 Cullinan
5,305,381 A 4/1994 Wang et al.
5,351,417 A 10/1994 Rubin
5,382,939 A 1/1995 Hong
5,408,382 A 4/1995 Schultz et al.
5,457,745 A 10/1995 Wang et al.
5,544,010 A 8/1996 Schultz et al.
5,568,691 A 10/1996 Rubin
5,644,471 A 7/1997 Schultz et al.
5,699,226 A 12/1997 Cavello
5,710,821 A * 1/1998 Cheah ........................ 381/332
5,739,665 A 4/1998 Bares
5,810,168 A 9/1998 Eggering
5,836,563 A 11/1998 Hsin-Yung et al.
5,839,097 A 11/1998 Klausner
5,864,120 A 1/1999 Vroom et al.
5,996,956 A 12/1999 Shawver
5,999,226 A 12/1999 Choi
6,011,852 A * 1/2000 Howard ....................... 381/28
6,023,147 A 2/2000 Cargin, Jr. et al.
6,130,727 A 10/2000 Toyozumi
6,131,812 A 10/2000 Schneider
6,191,942 B1 * 2/2001 Lee et al. ............... 361/679.23
6,208,117 B1 3/2001 Hibi
6,231,371 B1 5/2001 Helot
6,246,575 B1 6/2001 Barrus et al.
6,309,230 B2 10/2001 Helot
6,359,270 B1 3/2002 Bridson
6,375,344 B1 4/2002 Hanson et al.
6,378,537 B1 4/2002 DeHart
6,385,042 B1 * 5/2002 Chen ..................... 361/679.41
6,393,848 B2 5/2002 Roh et al.
6,415,036 B1 * 7/2002 Ritter et al. ................. 381/388
6,430,946 B2 8/2002 Roh et al.
6,453,687 B2 9/2002 Sharood et al.
6,480,753 B1 11/2002 Calder et al.
6,483,695 B1 11/2002 Hartstein
6,490,154 B2 12/2002 Thompson
6,519,144 B1 2/2003 Henrie et al.
6,557,756 B1 5/2003 Smith
6,559,882 B1 5/2003 Kerchner
6,608,399 B2 8/2003 McConnell et al.
6,634,910 B2 10/2003 Lieb et al.
6,646,866 B2 11/2003 Kao
6,682,161 B2 1/2004 Yun
D486,467 S 2/2004 Yuen
6,761,578 B1 7/2004 Stavely et al.
6,765,789 B2 7/2004 Yang
6,785,567 B2 8/2004 Kato et al.
6,788,529 B2 9/2004 Homer et al.
6,792,263 B1 9/2004 Kite
6,798,654 B2 * 9/2004 Chang et al. ........... 361/679.23
6,809,295 B1 10/2004 Vargas
6,832,618 B2 12/2004 DeHart
6,843,667 B2 1/2005 Khoury
6,853,399 B1 2/2005 Gilman et al.
6,860,764 B2 3/2005 Khoury
6,877,264 B2 4/2005 Mautz
6,910,549 B2 * 6/2005 Kung ......................... 181/199
6,927,871 B1 8/2005 Silverbrook et al.
6,941,399 B2 * 9/2005 Loh ........................... 710/300
6,961,239 B2 11/2005 Schedivy
6,963,936 B2 11/2005 Billington et al.
6,966,533 B1 11/2005 Kalis et al.
6,993,615 B2 1/2006 Falcon
7,034,902 B2 4/2006 Tajima
7,074,062 B2 7/2006 Khoury
7,080,812 B2 7/2006 Wadsworth et al.
7,090,141 B2 8/2006 Roh et al.
7,092,988 B1 8/2006 Bogatin et al.
7,094,110 B1 8/2006 Shelton
7,117,286 B2 10/2006 Falcon
7,126,569 B2 10/2006 Ootsuka
7,136,940 B2 11/2006 Roh et al.
7,146,306 B2 12/2006 Whitney
7,158,092 B2 1/2007 Shen et al.
7,219,942 B2 5/2007 Schedivy
7,272,420 B2 9/2007 Falcon et al.
7,404,298 B2 7/2008 Kim et al.
7,430,111 B2 9/2008 Lee et al.
2002/0080273 A1 6/2002 Harrison et al.
2002/0115353 A1 8/2002 Zeiler et al.
2002/0115480 A1 8/2002 Huang
2002/0186329 A1 12/2002 Tong et al.
2003/0014259 A1 1/2003 Ferragut, II et al.
2003/0103023 A1 6/2003 Ootsuka et al.
2003/0207623 A1 11/2003 Patel
2004/0004807 A1 1/2004 Kim et al.
2004/0070696 A1 4/2004 Roh et al.
2004/0093379 A1 * 5/2004 Roh et al. ................... 709/203
2004/0154318 A1 8/2004 Roh et al.
2004/0177624 A1 9/2004 Wo
2004/0186596 A1 9/2004 Roh et al.
2004/0216471 A1 11/2004 Kim et al.
2004/0262185 A1 12/2004 Mills
2005/0013103 A1 1/2005 Chandley
2005/0097912 A1 5/2005 Nam et al.
2005/0127870 A1 6/2005 Shin
2005/0129263 A1 * 6/2005 Tamura et al. .............. 381/333
2005/0134472 A1 6/2005 Jang et al.
2005/0138948 A1 6/2005 Lee
2005/0138949 A1 6/2005 Jang et al.
2005/0201067 A1 9/2005 Hu et al.
2005/0210168 A1 9/2005 Chen et al.
2005/0225292 A1 10/2005 Damlamian et al.
2005/0286900 A1 12/2005 Bentley et al.
2006/0007357 A1 1/2006 Lee
2006/0021360 A1 2/2006 Kim et al.
2006/0031617 A1 2/2006 Falcon
2006/0055553 A1 3/2006 Yeh
2006/0096303 A1 5/2006 Kavounas
2006/0106965 A1 5/2006 Falcon
2006/0116177 A1 6/2006 Kortum et al.
2006/0117810 A1 6/2006 Kendall et al.
2006/0118694 A1 6/2006 Lee et al.
2006/0125360 A1 6/2006 Kim et al.
2006/0130078 A1 6/2006 Zhang
2006/0144056 A1 7/2006 Oh
2006/0145576 A1 7/2006 Lee et al.
2006/0148575 A1 7/2006 Vitito
2006/0217600 A1 9/2006 Lee et al.
2006/0224050 A1 10/2006 Lee et al.
2006/0261220 A1 11/2006 Lee et al.
2007/0038434 A1 2/2007 Cvetko
2007/0044497 A1 3/2007 Roo et al.
2007/0086151 A1 4/2007 Oh et al.
2007/0118862 A1 5/2007 Jeong et al.
2007/0126413 A1 6/2007 Oh
2007/0143376 A1 6/2007 McIntosh
2007/0230910 A1 10/2007 Welch et al.
2007/0247800 A1 10/2007 Smith et al.
2008/0013284 A1 1/2008 Nagahashi
2008/0019082 A1 1/2008 Krieger et al.
2008/0101645 A1 * 5/2008 Rosen ........................ 381/389
2008/0165504 A1 * 7/2008 McCoy et al. ............... 361/724

2008/0192411 A1 8/2008 McCoy

FOREIGN PATENT DOCUMENTS

| | | | |
|---|---|---|---|
| CN | 1683877 | | 10/2005 |
| CN | 1683893 | | 10/2005 |
| DE | 19706565 | | 8/1998 |
| DE | 10242678 | | 4/2004 |
| EP | 1125537 | | 8/2001 |
| EP | 1600886 | | 11/2005 |
| GB | 828064 | | 2/1960 |
| GB | 2386177 | | 9/2003 |
| JP | 7318237 | | 12/1995 |
| JP | 2000274923 | | 10/2000 |
| JP | 2001289555 | | 10/2001 |
| JP | 2001324258 | | 11/2001 |
| JP | 2002243354 | | 8/2002 |
| JP | 2003065659 | | 3/2003 |
| KR | 2004025403 | A * | 3/2004 |
| KR | 20050059869 | | 6/2005 |
| KR | 20050094242 | | 9/2005 |
| KR | 2006074787 | A * | 7/2006 |
| KR | 20070004351 | | 1/2007 |
| KR | 2008057639 | A * | 6/2008 |
| WO | 9622718 | | 8/1996 |
| WO | 9901971 | | 1/1999 |
| WO | 2004051164 | | 6/2004 |
| WO | 2004105184 | | 12/2004 |
| WO | 2005047786 | | 5/2005 |
| WO | 2005057105 | | 6/2005 |
| WO | 2006067530 | | 6/2006 |

OTHER PUBLICATIONS

Article Entitled "Ford's F-150: The Winner and Still Champion?" by Christopher A. Sawyer—www.autofieldguide.com (4 pages) .

"I-Enabled Appliances", Copyright 2001 Whirlpool Corporation, 14 pages, Authored by Whirlpool Corporation, Published During 2001 by Whirlpool Corporation as a Self Contained Pamphlet. The Year of Publication is Sufficiently Earlier Than the Effective U.S. Filing Date and any Foreign Priority Date so That the Particular Month of Publication is not in Issue.

Written Answers to Questions About the Substance of the Disclosure of JP200306569 Submitted to a Japanese/English Translator. (No Translation was Requested or Provided).

Office Action for U.S. Appl. No. 11/619,731 Dated Feb. 6, 2008 (8 pages).

Office Action for U.S. Appl. No. 11/619,731 Dated Feb. 26, 2008 (8 pages).

* cited by examiner

ACOUSTIC CHAMBER AS PART OF ADAPTER

CROSS REFERENCE TO RELATED APPLICATIONS

The present application is a continuation of U.S. patent application Ser. No. 11/650,222 filed Jan. 4, 2007 entitled "ACOUSTIC CHAMBER AS PART OF ADAPTER OR APPLIANCE".

BACKGROUND

The present invention relates to household appliances. More specifically, the present invention relates to appliances that host additional useful devices.

For many U.S. families, a large amount of time spent in the home is spent in the kitchen. As a result, useful devices that are not traditionally located in the kitchen are being brought into the kitchen. Devices such as stereos, televisions and DVD players are now commonly located in the kitchen, typically on a countertop adjacent the traditional kitchen appliances.

One problem with bringing additional devices into the kitchen is that the devices take up counter space that is otherwise needed to perform kitchen tasks. To free up this counter space, it is known to place a television into a door of a refrigerator. However, at this time, the combination of appliances and other devices is limited to the refrigerator and television combination. Additionally, the devices are not readily removable from the host appliance, and the host appliance is not configured to receive different types of devices.

It would be an improvement in the art if there were provided an appliance that could host a variety of consumer electronic devices.

It would also be an improvement in the art if the host appliance provided enhanced acoustical functionality.

SUMMARY

The present invention provides an adapter that provides enhanced acoustical functionality.

In one embodiment, an adapter has a body insertable into the a compartment of an appliance and having a mating structure to be received by a receiving structure of the compartment. The adapter may have at least one acoustic chamber formed in the body, wherein the chamber is substantially enclosed except at an opening located adjacent an exterior surface of the appliance when the body is received in the compartment. The at least one acoustic chamber may be configured to interchangeably receive a plurality of different consumer electronic devices.

In variations of this embodiment, the at least one acoustic chamber may be configured to receive at least one of a consumer electronic device and speaker, may include a docking interface configured to receive a mating interface of on at least one of said consumer electronic device, or may include a chamber configured to receive a consumer electronic device or a speaker.

In yet another embodiment, an adapter for coupling to a host providing mechanical support and at least one electrical service, the adapter includes a main body, a substantially enclosed acoustic chamber formed in the main body and adapted to provide enhanced acoustical functionality; and at least one speaker disposed in the at least one acoustic chamber.

DETAILED DESCRIPTION OF THE DRAWINGS

Figure 1:
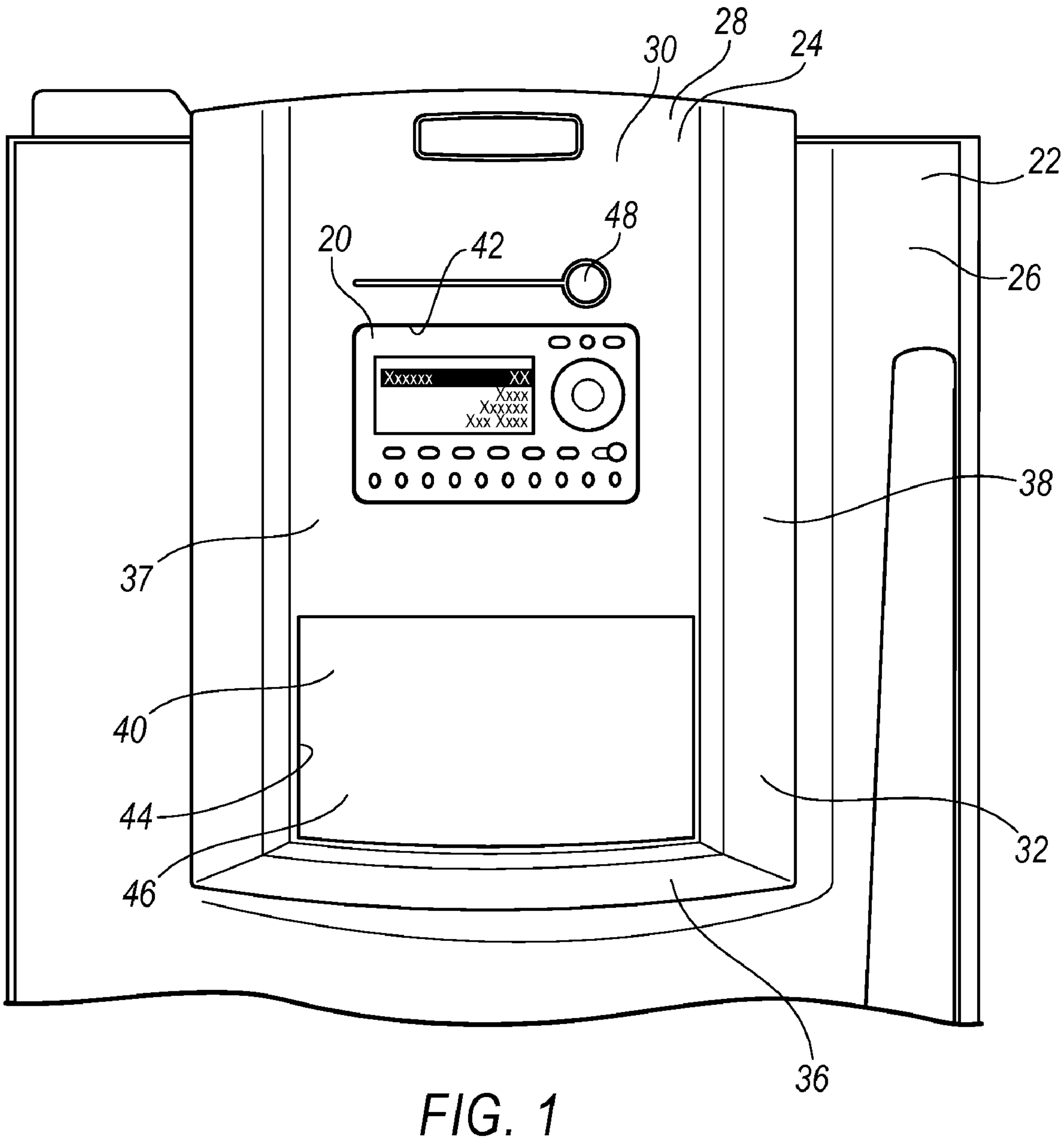
FIG. 1 is a partial, front elevational view of a host appliance and a holding device for holding a consumer electronic device and a speaker, where the holding device is mounted on the host appliance.
Figure 2:
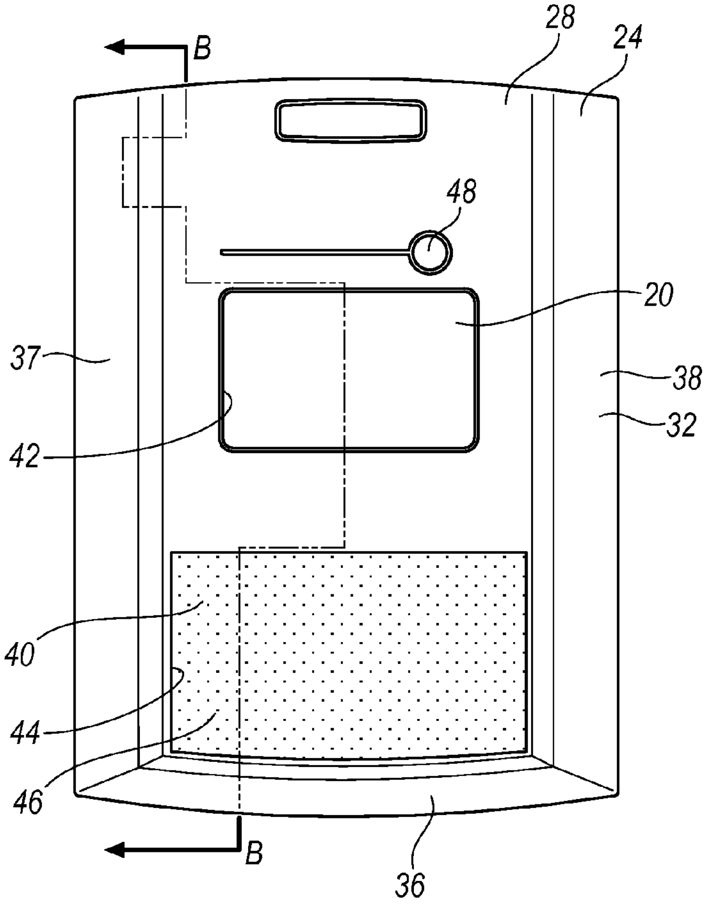
FIG. 2 is front elevational view of the holding device of FIG. 1 configured to be hung from a top surface of the appliance.
Figure 3:
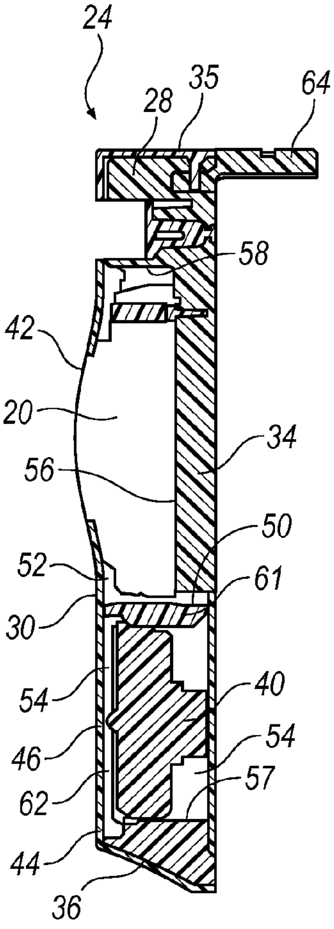
FIG. 3 is a side sectional view of the holding device taken generally along the line B-B of FIG. 2.

As illustrated in FIGS. 1-3, the present invention provides a consumer electronic device (CED) 20 that is mounted in a host appliance 22. Examples of portions of such systems or related systems are described in the following related applications: U.S. patent application Ser. No. 11/619,900 entitled "System for Supplying Service from an Appliance to Multiple Consumer Electronic Devices"; U.S. patent application Ser. No. 11/619,754 entitled "System for Connecting Mechanically Dissimilar Consumer Electronic Devices to an Adaptor or a Host"; U.S. patent application Ser. No. 11/619,836 entitled "Appliance with an Adapter to Simultaneously Couple Multiple Consumer Electronic Devices", U.S. patent application Ser. No. 11/619,907 entitled "Appliance with an Electrically Adaptive Adapter to Alternatively Couple Multiple Consumer Electronic Devices"; U.S. patent application Ser. No. 11/619,922 entitled "Removable Adapter Providing a Wireless Service to Removable Consumer Electronic Device"; U.S. patent application Ser. No. 11/619,894 entitled "Host with Multiple Adapters for Coupling Consumer Electronic Devices"; U.S. patent application Ser. No. 11/619,806 entitled "An Adapter for Coupling a Host and a Consumer Electronic Device Having Dissimilar Standardized Interfaces"; U.S. patent application Ser. No. 11/619,817 entitled "Host with Multiple Sequential Adapters for Multiple Consumer Electronic Devices"; U.S. patent application Ser. No. 11/619,845 entitled "Alternative Hosts for Multiple Adapters and Multiple Consumer Electronic Devices"; U.S. patent application Ser. No. 11/619,850 entitled "Appliance Door with a Service Interface"; U.S. patent application Ser. No. 11/619,912 entitled "Door with a Service Interface on an Edge"; U.S. patent application Ser. No. 11/619,873 entitled "A Dispenser with a Service Interface for a Consumer Electronic Device"; U.S. patent application Ser. No. 11/619,904 entitled "Service Supply Module and Adapter for a Consumer Electronic Device"; U.S. patent application Ser. No. 11/619,767 entitled "Adapter for Docking a Consumer Electronic Device in Discrete Orientations"; U.S. patent application Ser. No. 11/619,772 entitled "Host and Adapter for Selectively Positioning a Consumer Electronic Display in Visible and Concealed Orientations"; U.S. patent application Ser. No. 11/619,775 entitled "Host and Adapter for Selectively Positioning a Consumer Electronic Device in Accessible and Inaccessible Orientations"; U.S. patent application Ser. No. 11/619,718 entitled "Functional Adapter for a Consumer Electronic Device"; U.S. patent application Ser. No. 11/619,731 entitled "Adapter and Consumer Electronic Device Functional Unit"; U.S. patent application Ser. No. 11/650,222 entitled "Acoustic Chamber as Part of Adapter or Appliance"; U.S. patent application Ser. No. 11/649,932 entitled Electrical Accessory Charging Compartment for a Cabinet and Retrofit Components Therefor"; all of which are incorporated herein by reference in their entirety.

The CED 20 may, in some embodiments, be mounted in a host refrigeration appliance 22. While the following description will make reference to a refrigeration appliance as the host appliance 22, it should be appreciated that other appliances can be used to host the consumer electronic device 20, such as but not limited to microwave ovens, dishwashers, washing machines, clothes dryers, and stoves/cooking ranges. Further, while the following description will make reference to "consumer electronic devices" that transmit audio signals, such as satellite radios, high definition radios, and digital music players, the term "CED" refers to any device that transmits data, including but not limited to televisions, DVD players, CD players, personal computers, home weather stations, security systems, home environment controls, mobile phones, and baby monitors.

For all embodiments discussed below, it is contemplated that the host appliance 22 can removably and interchangeably receive a plurality of different CEDs 20. Further, it is contemplated that the CEDs 20 can be of the type that transfer only audio signals. Further, it is contemplated that for all embodiments of host appliance 22, the appliance can transfer data with the CED 20, and can also provide power to the CED.

In a first embodiment, the CED 20 is held in a holding device 24 that is mounted to a front surface 26 of the host refrigeration appliance 22. The holding device 24 includes a generally rectangular body 28 with a generally planar front face 30. Peripheral walls 32 are angled from a back panel 34 to the front face 30 to enclose the holding device 24, although other shapes of the holding device body 28 are envisioned. The peripheral walls 32 preferably include an upper wall 35, a lower wall 36, a first side wall 37 and a second side wall 38.

Preferably, at least one speaker 40 and the CED 20 are mounted into the body 28 of the holding device 24, with the CED mounted above the speaker or vice versa. A side-by-side arrangement of speaker 40 and CED 20 is also contemplated.

Figure 4:
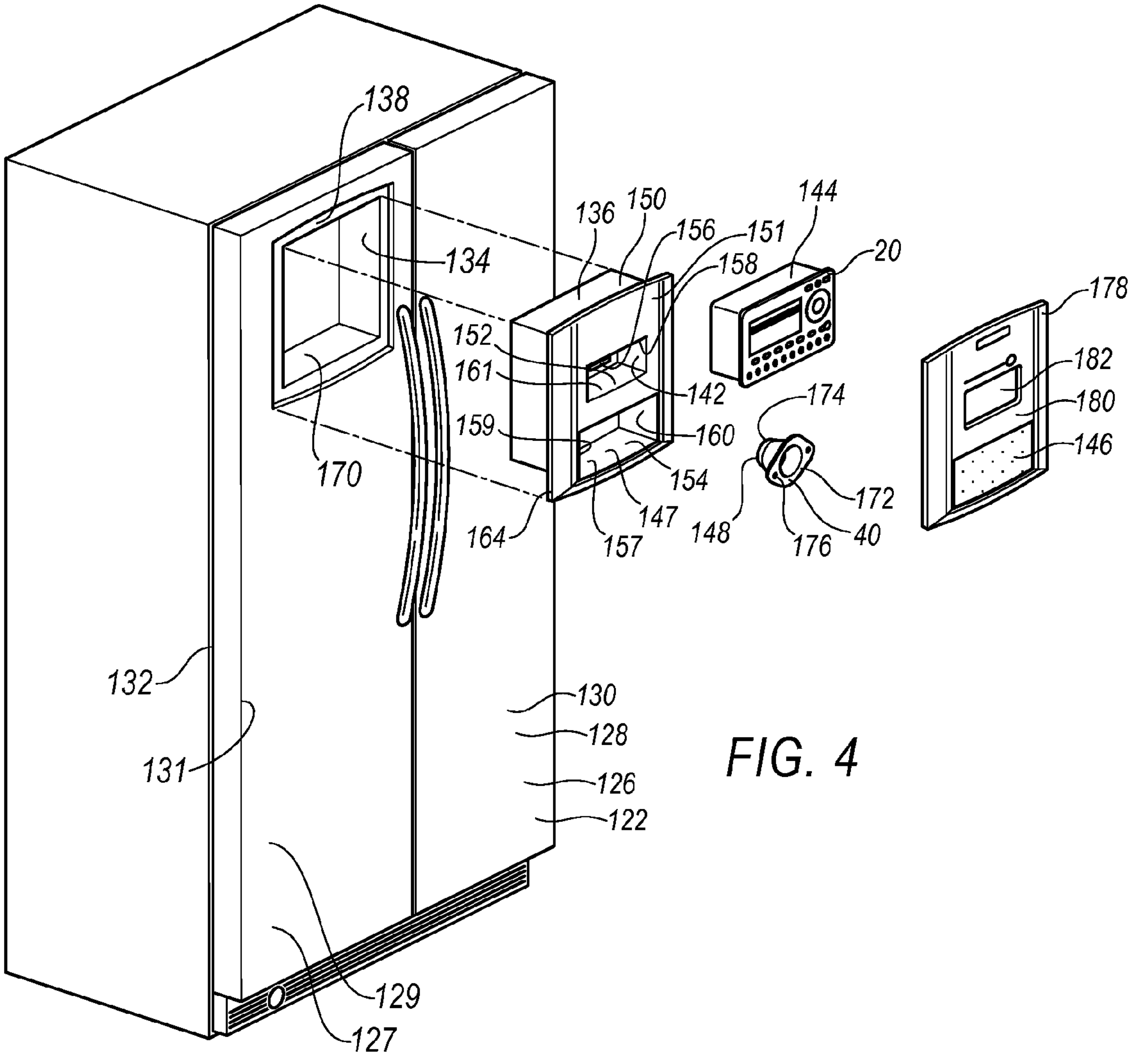
FIG. 4 is a front, exploded perspective view of a host refrigeration appliance incorporating an adapter for receiving a consumer electronic device and a speaker.

The front face 30 of the holding device 24 has a first aperture or access area 42 to permit the user access to the CED 20 mounted in the body 28, including access to a user interface 21 of the CED, such as a dial, an indicator or buttons, as shown in FIGS. 1 and 4. A second aperture 44 is formed in the front face 30 at the location of the speaker 40 in the body 28 to accommodate a speaker grill 46. The speaker grill 46 is of a conventional design that permits the transfer of audio from the speaker 40 to the ambient. The front face 30 of the holding device 24 can be removable from the back panel 34 of the body 28 to expose the CED 20 and the speaker 40, and can include other controllers 48 such as dials, indicators and buttons.

Inside the holding device 24 is an adapter 50 for docking the CED 20. Preferably, the adapter 50 includes first and second adapter chambers or compartments 52, 54 configured to receive the CED and the least one speaker 40, however the adapter can have one or more compartments.

In the preferred embodiment, the compartments 52, 54 are defined by a back surface 56, a bottom surface 57, a top surface 58, first and second side surfaces (not shown) and a middle wall 61, which may be integrally formed or formed in one or more parts. In this configuration, the compartments 52, 54 are generally rectangular with one open surface 62 opposite the back surface 56, and the first compartment 52 being arranged above the second compartment 54.

The compartment 54 in the adapter 50 for receiving the speaker 40 is configured for enhancing audio functionality and quality generated by the speaker. The enhanced functionality of the compartment 54 includes at least one of amplification, tuned frequency response, and sound directionality. In the adapter chamber or compartment 54, the speaker 40 and its associated pressure fluctuations are preferably separated from the CED 20 to maintain a stable environment for the CED, and to provide a robust acoustic environment for the speaker 40. While the above description refers to the compartment 54 of the adapter 50, the same description can be applied to the alternate embodiments described throughout.

The compartments 52, 54 are preferably sized and arranged such that the rearmost extremities of the CED 20 and the speakers 40 abut the back surface 56. In the embodiment of FIGS. 2 and 3, the back panel 34 is thicker at the location of the CED 20 than at the location of the speakers 40. The back surface 56 positions the CED 20 to protrude slightly through the open surface 62 and to the access area 42 of the front face 30. The back surface 56 also positions the speaker 40 adjacent the speaker grill 46.

While the preferred holding device 24 accommodates both the CED 20 and the speakers 40, an embodiment that holds only the CED or only the speakers is envisioned. In the preferred embodiment, the CED 20 is a satellite radio, however, it is contemplated that other CEDs could be used.

In one embodiment, the CED 20 is readily removable from the device holder 24 to enable the user to switch from one CED for another. For example, the user can remove the satellite radio and dock a digital music player into the adapter 50. The adapter 50 may be provided with multiple data connections (not shown) for different types of CEDs 20. Additionally, electronic adapters (not shown) could be provided to allow CEDs 20 having varying output devices (not shown), such as digital music players made by different manufacturers, to be switched in and out of the adapter 50.

A mounting structure 64, such as a bracket or flange, extends generally perpendicularly from the front face 30 of the holding device 24 to hang the holding device from a top surface 66 of the host appliance 22. In this configuration, the back panel 34 of the holding device 24 abuts the front surface 26 of the host appliance 22 and the holding device protrudes from the front surface of the host appliance. Alternately, the holding device 24 can be recessed into a chamber (not shown) in the host appliance 22.

Referring now to FIG. 4, a second embodiment of host refrigeration appliance is shown. Components shared with the first embodiment are designated with identical reference numbers in the 100-series. The host refrigeration appliance 122 includes a first cooling cavity 127 and a second cooling cavity 128 that could be maintained at a different temperature than the first cooling cavity. In the preferred embodiment, one cooling cavity is kept above freezing and one cooling cavity is kept below freezing. A first door 129 and a second door 130 are located at a front surface 126 of the refrigeration appliance 122 and are associated with the first cooling cavity 127 and the second cooling cavity 128, respectively.

The host refrigeration appliance 122 has a chamber 170 formed into a front surface 126 of the appliance, which in the preferred embodiment is at a door 127 of the host appliance. The door 127 has an exterior surface 131 forming the front surface 126 of the host appliance 122, and an interior surface 132 enclosing one of the first or second cooling cavities 127, 128. The chamber 170 is disposed between the interior surface 132 and the exterior surface 131 of the door 127, and the chamber is substantially enclosed except at the exterior surface. The chamber 170 is sized, shaped and arranged to enhance acoustical functionality.

Specifically, the chamber 170 is preferably configured to receive an adapter 150. The adapter 150 has a body 151 including at least one compartment 152, and in the preferred embodiment, the adapter has a first compartment that receives a CED 20 and a second compartment 154 that receives at least one speaker 40. However, it is contemplated that only one compartment 152 for the CED 20 can be provided, and that the speaker 40 can be located remotely. In the case of a remote speaker 40, the speaker can be connected to the host refrigeration appliance 122 with a digital wired network, such as the Ethernet, a wireless data connection via a digital wired network, or an analog data connection, among other types of connections.

Similar to the previous embodiment, the adapter chamber or compartment 154 in the adapter 150 for receiving the speaker 40 is configured for enhancing audio quality generated by the speaker. The door 127 is configured to support the weight of the speaker 40 in the chamber 70. In the adapter chamber or compartment 154, the speaker 40 and its associated pressure fluctuations are preferably separated from the CED 20 to maintain a stable environment for the CED, and to provide a robust acoustic environment for the speaker 40. While the above description refers to the compartment 154 of the adapter 50, the same description can be applied to the alternate embodiments described throughout.

In the preferred embodiment, the first and second compartments 152, 154 of the adapter 150 are defined by a back surface 156, a bottom surface 157, a top surface 158, first and second side surfaces 159,160, and a middle wall 161, which may be integrally formed or formed in one or more parts. The resulting compartments 152, 154 are generally rectangular, however any shape of compartment is envisioned. An opening 162 is located opposite the back surface 156, and a lip 164 is preferably disposed around at least a portion of the periphery of the adapter 150.

The chamber 170 preferably has a receiving structure 134 configured to receive the adapter 150. The adapter 150 likewise has a mating structure 136 to be received by the chamber 170. Preferably, the adapter 150 nests or positively engages the chamber 170, however any receiving structure 134 and any mating structure 136 sufficient to maintain the adapter in the chamber is envisioned. In the preferred embodiment, the adapter 150 is generally rectangular and is received in the generally rectangular chamber 170, however additional retainers (not shown) may be incorporated with the receiving structures.

A recessed surface 138 is preferably disposed around at least a portion of the periphery of the chamber 170 to receive the lip 164 of the adapter 150. It is contemplated that additional retainers or fasteners (not shown) can be used to attach the lip 164 to the recessed surface 138. Additionally, it is contemplated that removable retainers (not shown) can be used to attach the adapter 150 to chamber 170.

A docking structure 142 is located on the adapter 150 and is configured for receiving the CED 20. The CED 20 preferably has a corresponding docking structure 144. Preferably, the CED 20 nests or positively engages the adapter 150, however any corresponding docking structure 144 sufficient to maintain the CED 20 in the adapter is envisioned. In the preferred embodiment, the first compartment 152 is generally rectangular and the CED 20 is preferably rectangular, however additional retainers (not shown) can be incorporated with the docking structures 142, 144.

The CED 20 is docked in the docking structure 142 by introducing the CED into the opening 162 of the compartment 152. In the preferred embodiment, the opening 162 is adjacent the exterior surface 131 of the door 129 when the adapter 150 is mounted in the chamber 170. In this way, the CED 20 is accessible from the exterior surface 131.

Likewise, a speaker docking structure 147 is located on the adapter 150 at the second compartment 154, and the speaker 40 has a corresponding docking structure 148 to locate the speaker in the compartment. Any structure that will sufficiently retain the speaker 40 in the compartment 154 is envisioned.

The first and the second compartments 152, 154 are preferably substantially enclosed except at the opening 162. Specifically, the compartment 154 housing the speaker 40 is preferably enclosed (except at the speaker grill 146) to provide acoustic amplification and/or enhancement. Preferably, the walls 156, 157, 159, 160, 161 of the second compartment 154 securely hold the speaker 40 such that a sound emitting surface 172 of the speaker is adjacent the front surface 126 of the host refrigeration appliance 122. Further, while a rear speaker structure 174 preferably abuts the back surface 156 of the adapter 150, preferably a front speaker structure 176 is spaced from the back surface to eliminate or reduce noise created by vibration or reverberation of the speaker.

Since the surfaces 156-161 of the compartment 154 are preferably solid and contiguous, the speaker 40 located in the compartment is sealed off from an interior surface 132 of the host refrigeration appliance 122. Alternately, if the compartment 154 itself is not substantially enclosed, the adapter 150 when mounted into the chamber 170 can cooperate to seal off the speaker 40 from the interior surface 132 of the host refrigeration appliance 122. In either configuration, it is preferred that the speaker 40 is sealed off from the interior surface 132 of the host refrigeration appliance 122 in an air-tight manner.

The CED 20 is connected to the speaker 40 to transmit an audio signal. Such a connection can be accomplished in a number of ways, including but not limited to an analog wired connection, a digital wired network, a wireless data connection via a digital wired network, or an analog data connection, among other types of connections. It is contemplated that all or some of the components necessary for the transmission of data from the CED 20 to the speaker 40 can be located in the adapter 150, in the chamber 170, in the host refrigeration appliance 122, or in some combination of the above components.

The connection between the CED 20 and the speaker 40 can be accomplished with any known data connection or interface. In the preferred embodiment, all components for the connection between the CED 20 and the speakers 40 are located in the adapter. The CED 20 includes a first audio/data connector (not shown) which connects to a second audio/data connector (not shown) on the first compartment 152. The second audio/data connector (not shown) is connected to a third audio/data connector (not shown) on the second compartment 154, and the third audio/data connector (not shown) connects to a fourth audio/data connector (not shown) on the speaker 40.

In an alternate embodiment, the connection between the CED 20 and the speaker 40 includes a connection to the host refrigeration appliance 122. Further, the host refrigeration appliance 122 may provide power to the CED 20, or the CED may operate on battery power.

Over the top of the adapter 150 is an adaptive component 178, which is preferably a generally planar plate 180 that hides the adapter. The adaptive component 178 provides both an aesthetic service and permits access to the CED 20 through an access opening 182. The adaptive component 178 attaches either to the adapter 150 or to the host refrigeration appliance 122, and is preferably generally flush with the front surface 126 of the host refrigeration appliance. Preferably, the adaptive component 178 is readily removable so that the user is provided with greater access to the CED 20 and the adapter 150.

In one embodiment, the CED 20 is readily removable from the adapter 150, either by removing the adaptive component 178 or through the access opening 182, to enable the user to switch from one CED to another. Additionally, universal connectors or electronic adapters (not shown) could be provided to allow CEDs 20 with varying output devices (not shown), such as digital music players made by different manufacturers, to be switched in and out of the adapter. Alternately, different types of CEDs 20 can be interchanged into the adapter 150, such as a satellite radio to a digital music player.

Figure 5:
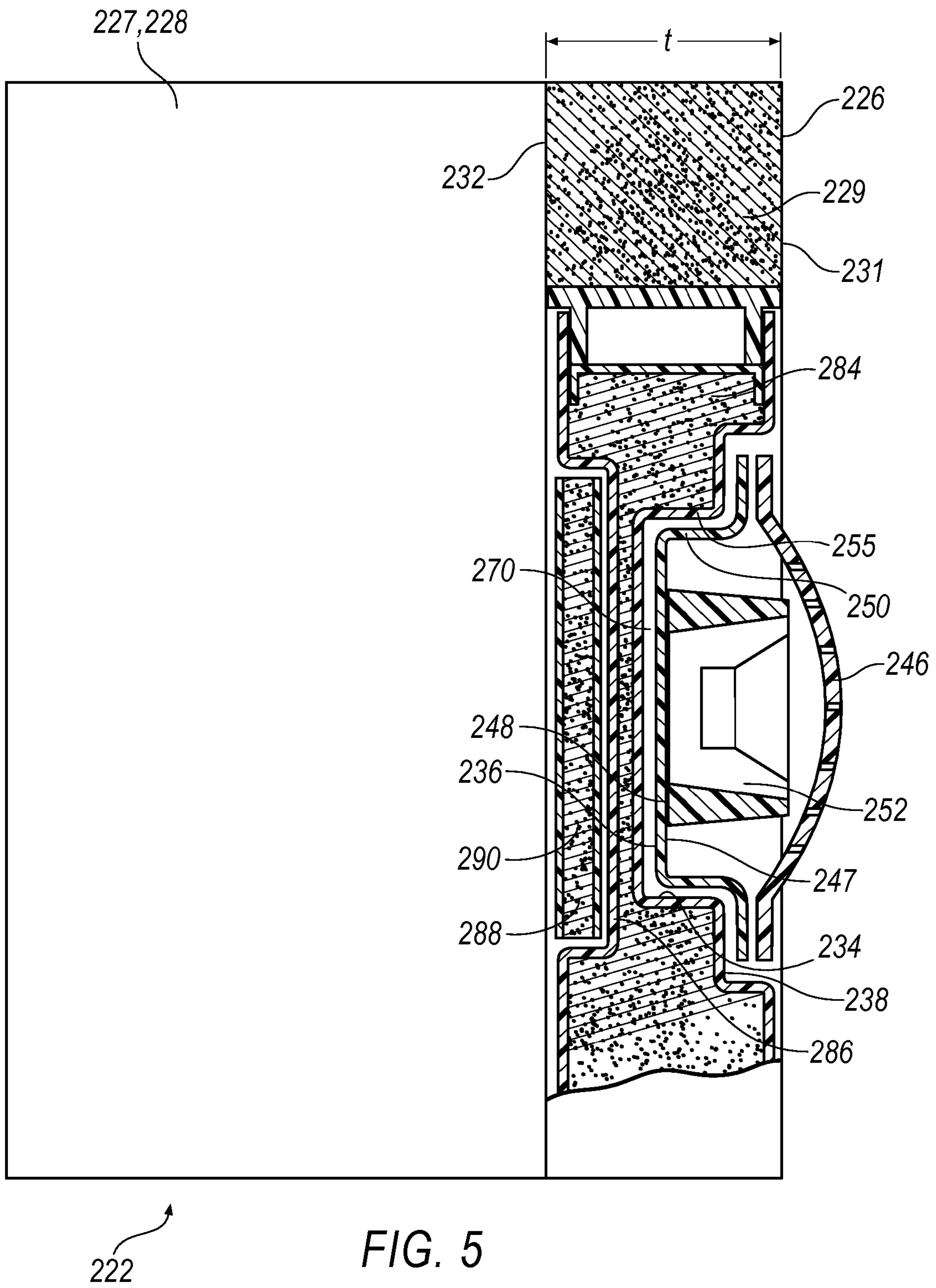
FIG. 5 is a side sectional view of an alternate embodiment of an adapter mounted in a door of a host refrigeration appliance.

Referring now to FIG. 5, components shared with the previous embodiments are designated with identical reference numbers in the 200-series. A chamber 270 is preferably formed in a surface 226 of a door 229 of a host refrigeration appliance 222. An adapter 250 has a single compartment 252 configured for housing at least one speaker 40. The adapter 250 is configured to be received in the chamber 270.

Similar to the previous embodiments, the compartment 252 for receiving the speaker 40 is configured for enhancing audio quality generated by the speaker. The door 229 is configured to support the weight of the speaker 40 in the chamber 270. In the compartment 252, the speaker 40 and its associated pressure fluctuations are separated from the CED 20 to maintain a stable environment for the CED, and to provide a robust acoustic environment for the speaker 40. While the above description refers to the compartment 252, the same description can be applied to the alternate embodiments described throughout.

The adapter 250 is preferably mounted in the chamber 270 to be flush with or recessed from the front surface 226 of the host refrigeration appliance 222. A speaker grill 246 is preferably disposed over the adapter 250 and may protrude slightly from the front surface 226 of the host refrigeration appliance 222. In alternate embodiments, the adapter 250 itself can protrude slightly from the front surface 226 of the host refrigeration appliance 22. Further, the adapter 250 can be located in a holding device 24 that is hung from the top surface 66 of the host refrigeration appliance (FIGS. 1-3).

Similar to the embodiment of FIG. 4, the door 229 has a thickness “t” defined by an exterior surface 131 forming the front surface 226 of the host refrigeration appliance 222, and an interior surface 232 enclosing the cooling cavities 227, 228. The chamber 270 is disposed between the interior surface 232 and the exterior surface 231 of the front door 229, and the chamber is substantially enclosed except at the exterior surface. The chamber 270 is configured to enhance and/or amplify sound.

The chamber 270 is defined by at least one chamber wall 155, which may be formed in one or more parts. The specific geometry of the chamber wall 155 can vary, however, preferably the adapter 250 has a generally flush engagement with the chamber wall.

The chamber 260 has a receiving structure 234 configured to receive the adapter 250. The adapter 250 likewise has a mating structure 236 to be received by the chamber 270. Preferably, the adapter 250 nests or positively engages the chamber 270, however any receiving structure 234 and any mating structure 236 sufficient to maintain the adapter 250 in the chamber 270 is envisioned. The chamber 270 preferably includes a recessed surface 238 around at least a portion of the periphery for receiving a lip 264 of the adapter 250. Additionally, it is contemplated that the adapter 250 is readily removable from the chamber 270.

A docking structure 247 is located on the adapter 250 and is configured for receiving at least one speaker 40. The speaker 40 preferably has any corresponding docking structure 248 sufficient to maintain the speaker in the adapter 250.

The door 229 is preferably hollow and is filled with a pre-selected material in the region adjacent the chamber to support the speaker. Behind the chamber wall 255 is a first insulation material 284, preferably of a high grade. The first insulation material 284 preferably extends within the door 229 at least around the vicinity of the chamber 270. The first insulation material 284 preferably has higher insulation value in the door 229 in the region of the acoustical chamber 270 to minimize heat leakage from the chamber to the host, or from the host to the chamber.

In the preferred embodiment, a rear interior wall 286 is formed along at least a portion of the chamber 270 forming a back cavity 288 between the rear interior wall and the interior surface 132. In the back cavity 288, a second insulating material 290 is disposed. The second insulating material 290 is preferably of even higher grade than the first insulating material 284. In an alternate embodiment, only one insulating material is used, and in a further embodiment, more than two insulating materials are used.

The layers of insulation protect the speaker 40 (and/or a CED) from the temperatures reached in the interior of the host refrigeration appliance 222. Further, the insulation lessens the vibration of host refrigeration appliance components during use of the speakers 40.

Figure 6:
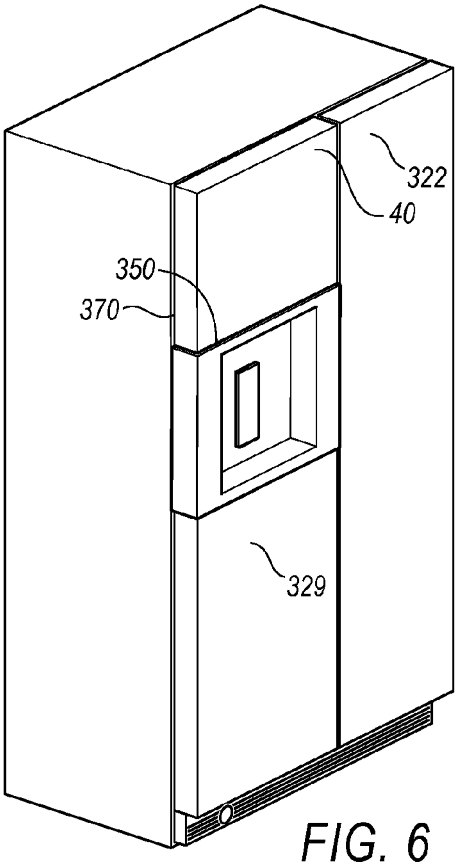
FIG. 6 is a front perspective view of a host refrigeration appliance having a chamber and an audio receiver, where the audio receiver delivers data to speakers that are received in the chamber.

Referring now to FIG. 6, components shared with the previous embodiments are designated with identical reference numbers in the 300-series. In the embodiment of FIG. 6, the host refrigeration appliance 322 includes at least one speaker 40, and the CED 20 is located remotely from the host refrigeration appliance. Similar to the previous embodiments, a chamber 370 is located on a door 329 for receiving an adapter 350, and the adapter has a docking structure (not shown) for receiving the speaker 40. Alternately, the speaker 40 can be directly mounted to the chamber 370.

The connection between the remote CED 20 and the host refrigeration appliance 322 and/or the speakers 40 can be accomplished with any known data connection. In the preferred embodiment, a first audio/data connector on the CED 20 preferably sends an audio signal to a second audio/data connector (not shown) located at a receiver (not shown) at the host refrigeration appliance 322. The connection between the first and second audio/data connectors is preferably wireless. The receiver or the second audio/data connector (not shown) then transfers the audio signal to the speakers 40, through any type of connection known in the art.

Figure 7:
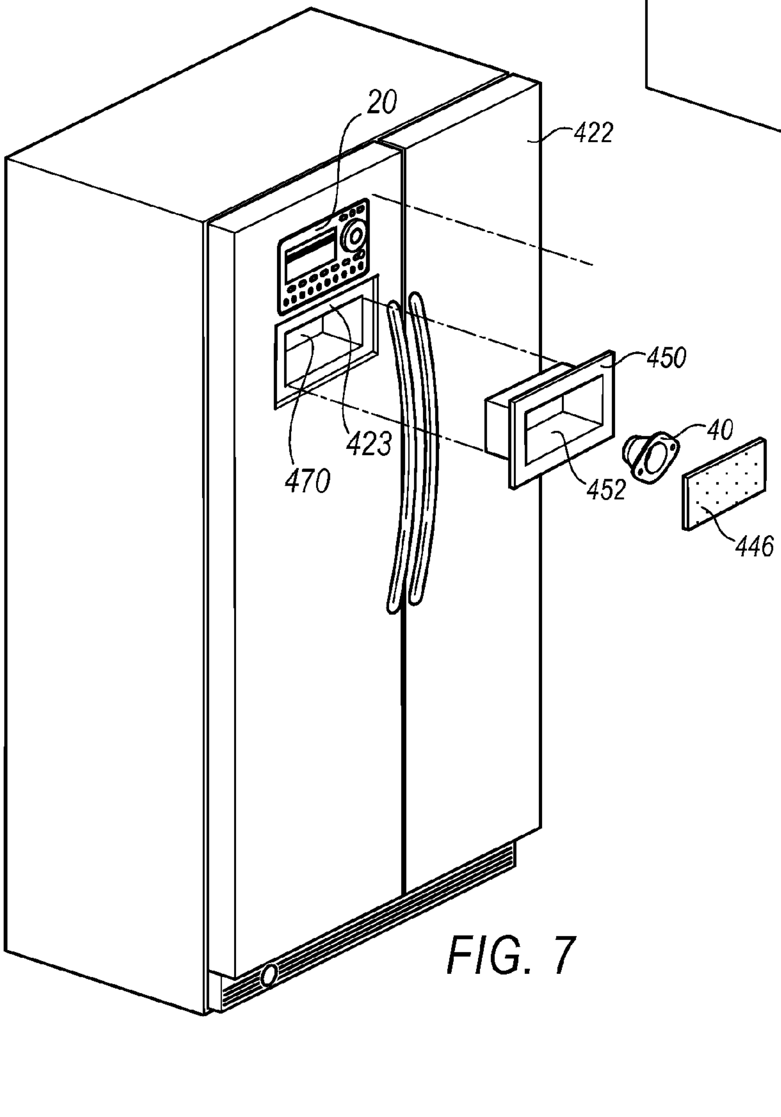
FIG. 7 is a front perspective view of a refrigeration appliance having a chamber and the consumer electronic device, where the chamber receives an adapter for a speaker.

In FIG. 7, components shared with the previous embodiments are designated with identical reference numbers in the 400-series. At least one CED 20 is located in the host refrigeration appliance 422. The CED 20 is either mounted directly into a chamber 470, or alternately, has its own adapter 450 that is mounted into the chamber. A speaker grill 446 is attachable either to the adapter 450 or to the chamber 470.

In the preferred embodiment, at least one speaker 40 is located in a main adapter 450 having at least one compartment 452. In one embodiment, the main adapter 450 is attachable to the chamber 470, as discussed with the previous embodiments. In another embodiment, the main adapter 450 is attachable to a service interface 423 (a preexisting chamber 470 used for various services, such as liquid and ice dispensing) of the host refrigeration appliance 422.

The speakers 40 are connected to the CED 20 with any audio/data connector known in the art. In a first embodiment, the audio/data connector includes jacks and audio wire. Preferably, the audio/data connector includes at least one female jack associated with the service interface 423 (or chamber), and connecting to female jacks of the main adapter 450 with male-male jacks and wire. In a second embodiment, the audio/data connector is a digital wired network, such as the Ethernet. In a third embodiment, the audio/data connector is a wireless connection via a digital wired network, such as wi-fi or Blue Tooth®. In a fourth embodiment, the audio/data connector is an analog data connection where the main adapter has a short range FM receiver which connects to the speaker 40.

Figure 8:
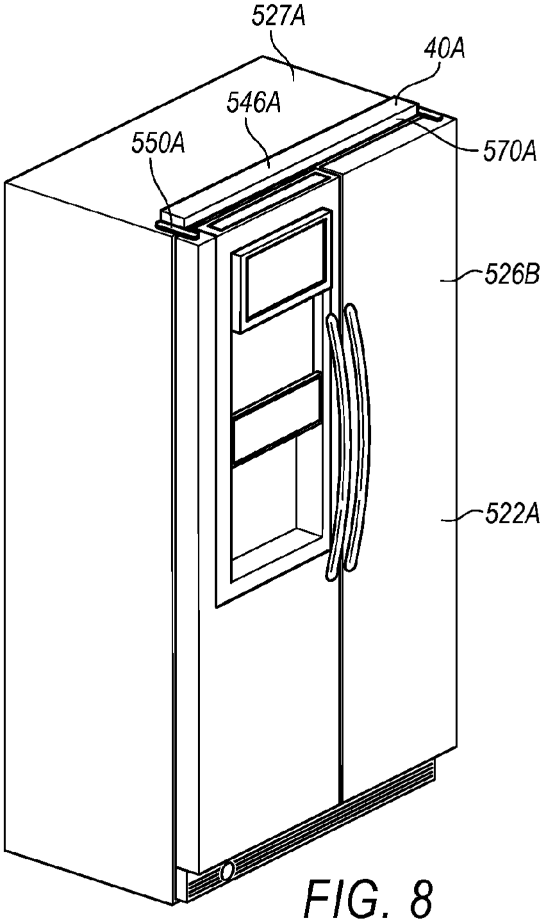
FIG. 8 is a front perspective view of an alternate embodiment of speakers mounted on the top surface of a host refrigeration appliance.
Figure 9:
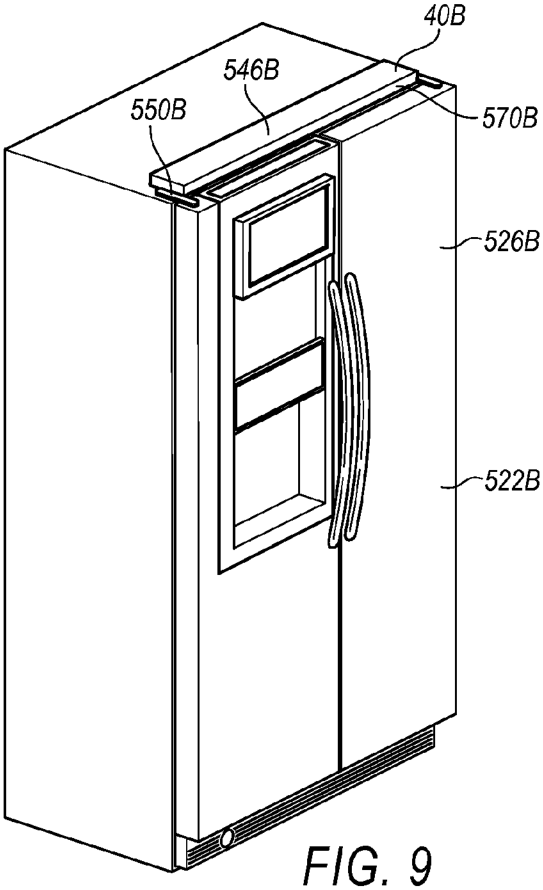
FIG. 9 is a front perspective view of another alternate embodiment of speakers mounted on the top surface of the host refrigeration appliance.

Referring now to the different speaker embodiments of FIGS. 8-14, components shared with the previous embodiments are designated with identical reference numbers in the 500-series, and components differing from each other within FIGS. 8-14 are assigned sub-classes A-G. Referring specifically to FIGS. 8 and 9, two alternate embodiments of top-mounted speakers 40A, 40B are shown. In both embodiments, the speakers 40A,B have a low profile to permit the host refrigeration appliance 522 to be situated under overhead cabinet doors.

In the embodiment of FIG. 8, the speakers 40A are configured to face forward and generally parallel to a top surface 527A of the host refrigeration appliance 522A, and in the embodiment of FIG. 9, the speakers 40B are configured to face upward and generally parallel to a front surface 526B. Similar to the previous embodiments, the speakers 40A, B can either be directly received into a chamber 570A,B formed into the host refrigeration appliance 522A,B, or can be received in an adapter 550A,B that is mounted into the chamber. A speaker grill 546A,B can be placed over the chamber 570A,B or the adapter 550A,B.

Similar to the previous embodiments, the connection between the speakers 40A, 40B and the CED 20 and/or the host refrigeration appliance 522A,B can be accomplished with any known data connection. Further, the CED 20 can be located remotely to or within the host refrigeration appliance 522A,B. Additionally, the speakers 40A, B can be used in conjunction with other devices, such as televisions and DVD players.

Figure 10:
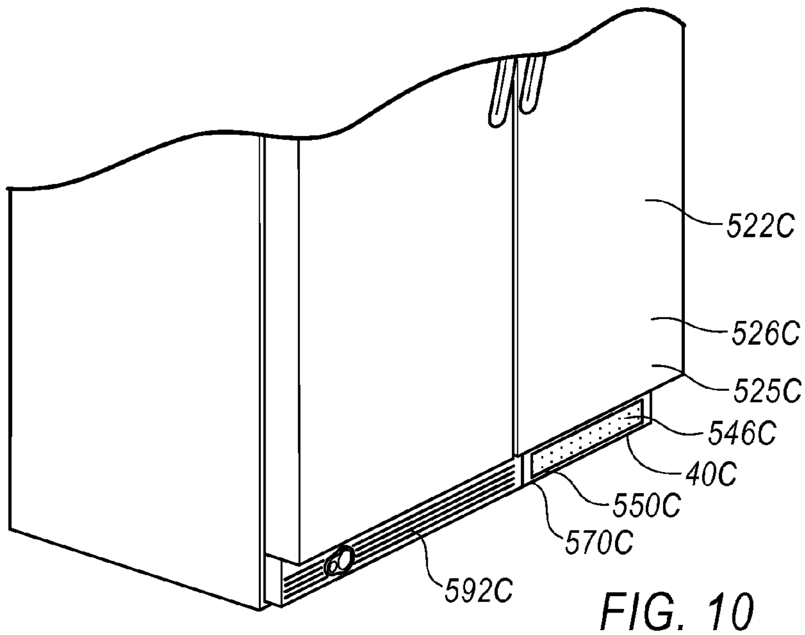
FIG. 10 is a partial, front perspective view of an alternate embodiment of speakers mounted in a chamber located on a lower front surface of a host refrigeration appliance.

An alternate embodiment of speaker 40C is shown in FIG. 10. At least one speaker 40C is placed either directly into a chamber 570C or into an adapter 550C that is located at a bottom portion 525C of the front surface 526C of a host refrigerator appliance 522C. Specifically, the at least one speaker 40C is located at a toe plate 592C. The CED 20 can be located in the host refrigeration appliance 522C, or can be located remotely from the host. Similar to the previous embodiments, the connection between the speakers 40C and the CED 20 and/or host refrigeration appliance 522C can be accomplished with any known data connection. A speaker grill 546C can be placed over the chamber 570C or the adapter 550C.

Figure 11:
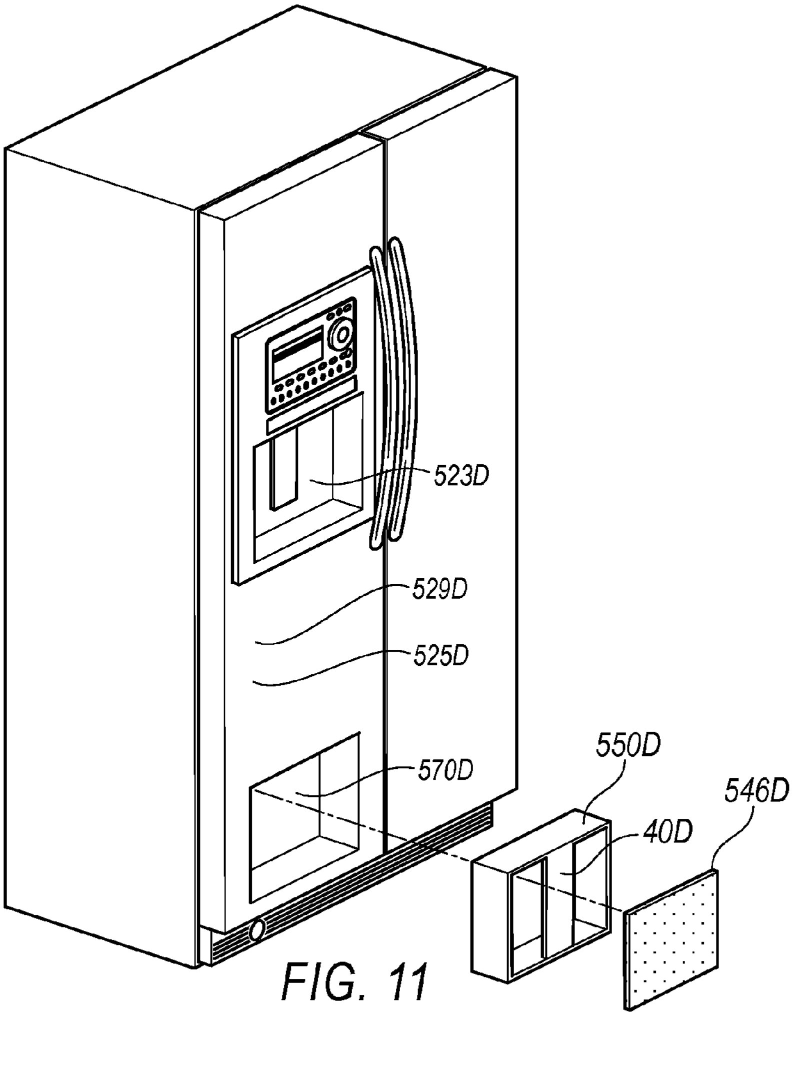
FIG. 11 is a partial, front perspective view of another alternate embodiment of speakers mounted in an adapter to be received in a chamber located in a lower portion of a door panel of a host refrigeration appliance.

Another embodiment of speaker 40D is shown in FIG. 11. At least one speaker 40D is placed either directly into a chamber 570D or into an adapter 550D that is configured to be received at bottom portion 525D of a door 529D of a host refrigerator appliance 522D. It is contemplated that the consumer can interchange speakers 40D as desired. Further, the CED 20 can be located in the host refrigeration appliance 522D (either directly or through an adapter 550D), or can be located remotely from the host. A service interface 523D can also be located on the door 529D of the host refrigeration appliance 522D. A speaker grill 546D can be placed over the chamber 570D or the adapter 550D.

Figure 12:
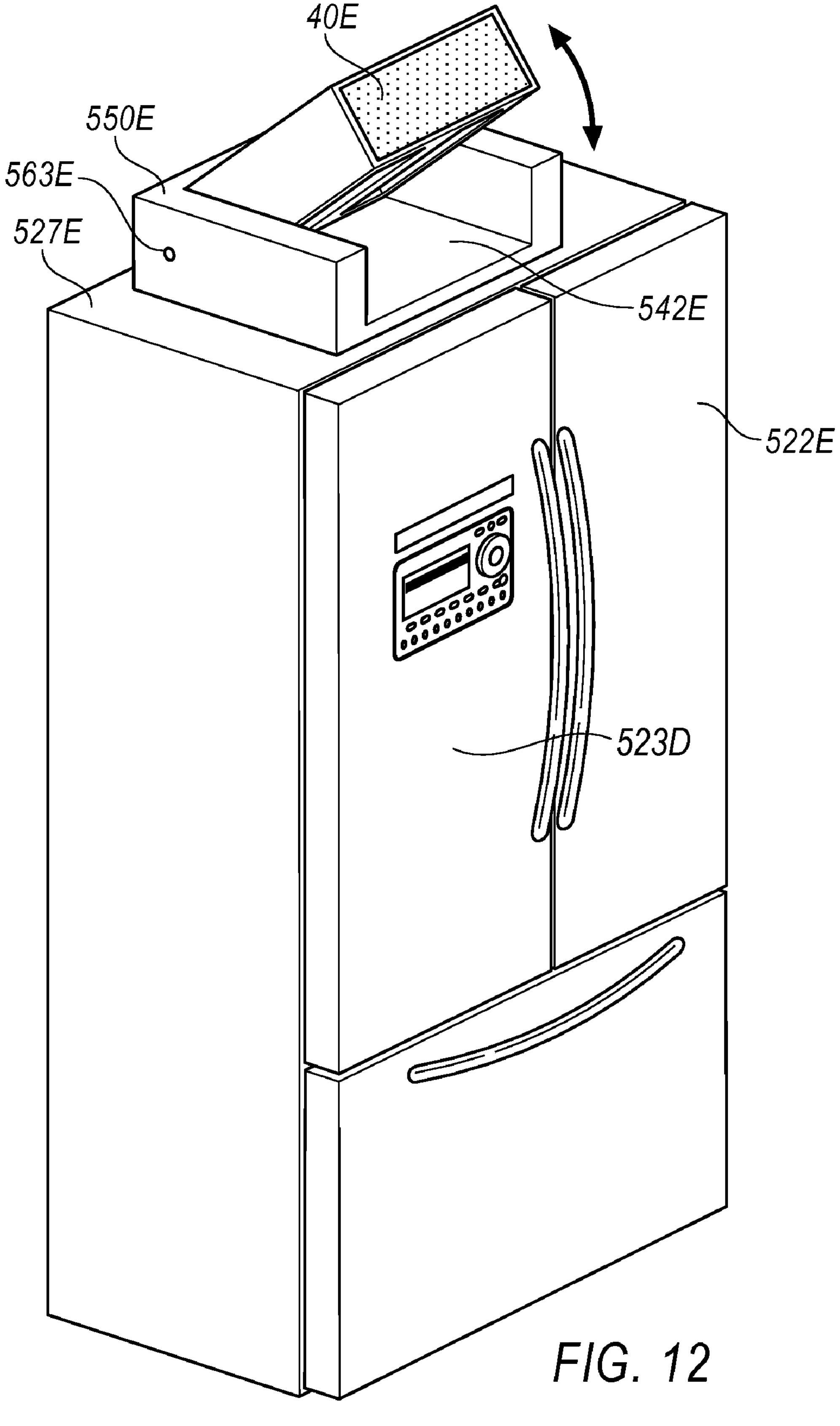
FIG. 12 is a front perspective view of a further alternate embodiment of speakers mounted in an adapter that is configured to be received in a receiving structure located on a top surface of a host refrigeration appliance, where the adapter permits multiple speaker orientations.

Referring now to FIG. 12, a further embodiment of speaker 40E is shown. At least one speaker 40E is located in an adapter 550E on a top surface 527E of a host refrigeration appliance 522E. In the preferred embodiment, the adapter 550E is cradle-shaped having a docking structure 542E for receiving the speaker 40E. At least a portion of the cradle is open for ease of insertion and removal of the speaker 40E, as well as acoustical projection of audio.

The adapter 550E has a pivot structure 563E that allows the speaker 40E to be pivoted into multiple orientations. In the preferred embodiment, the speaker 40E pivots with respect to the adapter 550E, however it is contemplated that the entire adapter can pivot with respect to the top surface 527E of the host refrigeration appliance 522E.

Being able to manipulate the orientation of the speaker 40E can allow a speaker position that hides or makes the speaker less conspicuous, optimizes the sound, and/or directs the sound in an acoustically advantageous way. Further, manipulation of the speaker 40E can allow an orientation that is advantageous for exchanging one speaker for another into the docking structure 542E, or for changing the connections to the adaptor. It is contemplated that the speaker 40E can be positionable in a fully stowed position within a chamber 570 in the top surface of the host 22. Additionally, if the host refrigerator appliance 522E provides other services, it may be advantageous to move the speaker 40E out of the way.

Figure 13:
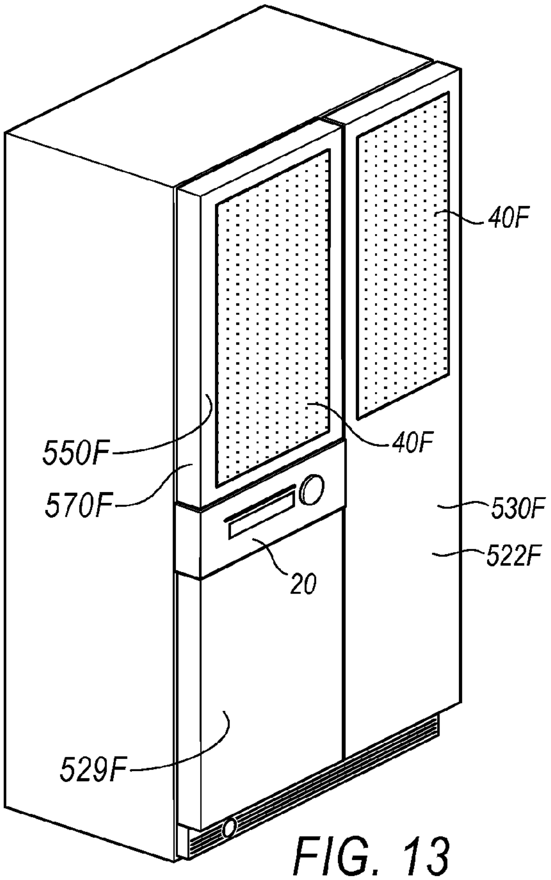
FIG. 13 is a front perspective view of a host refrigeration appliance having the consumer electronic device and an alternate embodiment of speakers mounted in an upper portion of a door panel.

As illustrated in FIG. 13, the host refrigerator appliance 522F can include speakers 40F of varying size and locations, and can include multiple speakers. Preferably, the speakers are 40F are located on first and second doors 529F, 530F at a height that will maximize acoustical projection. Further, the speakers 40F can be mounted directly into a chamber 570F or onto an adapter 550F that is mounted in a chamber. A CED 20 can be mounted on the host refrigeration appliance 522F or can be located remotely.

Figure 14:
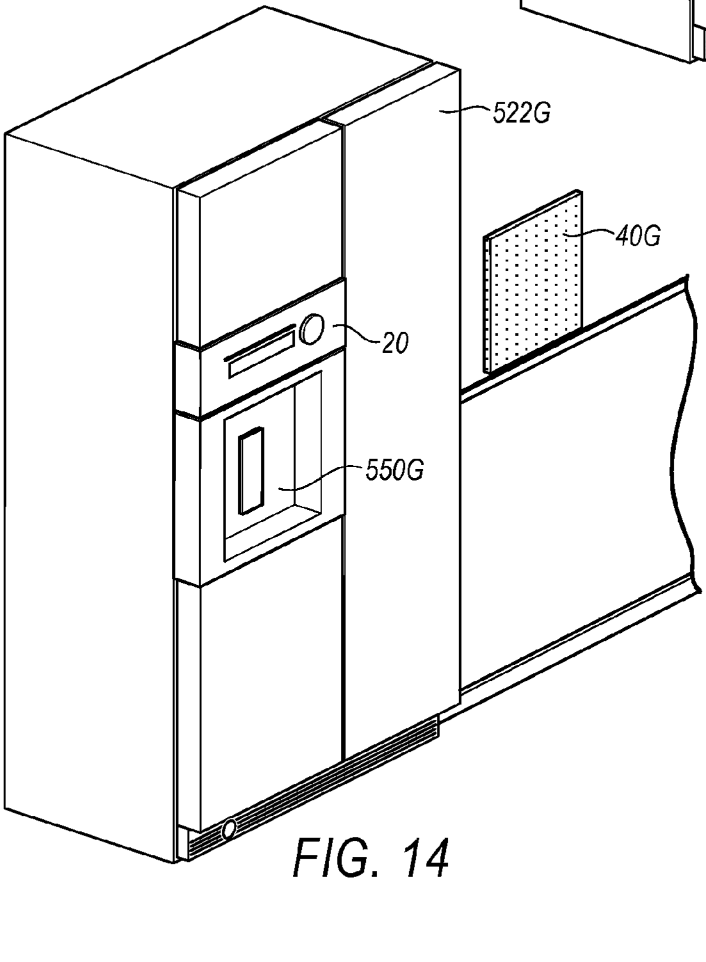
FIG. 14 is a front perspective view of a host refrigeration appliance having the consumer electronic device and a receiving aperture for receiving a speaker, where the speaker is remotely located from the refrigeration appliance.

As shown in FIG. 14, the host refrigerator appliance 522G can include a CED 20 that operates a speaker 40G that is remotely located. Further, the speaker 40G can be stored directly in a chamber 570G on the host refrigerator appliance 522G or can be received in an adapter (not shown) that is placed into the chamber. Preferably, the speaker 40G is connected via a wireless connection to a CED 20 mounted in the host refrigeration appliance 522G.

Figure 15:
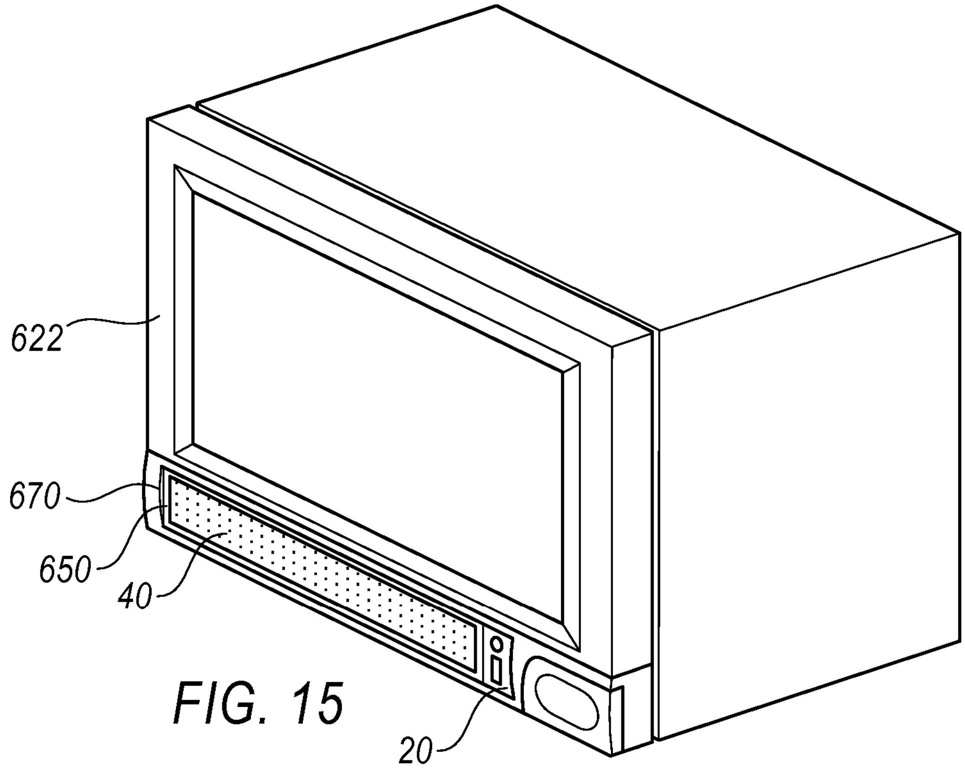
FIG. 15 is a front perspective view of a host microwave appliance having the consumer electronic device and a speaker mounted in a lower front face of the microwave appliance.
Figure 16:
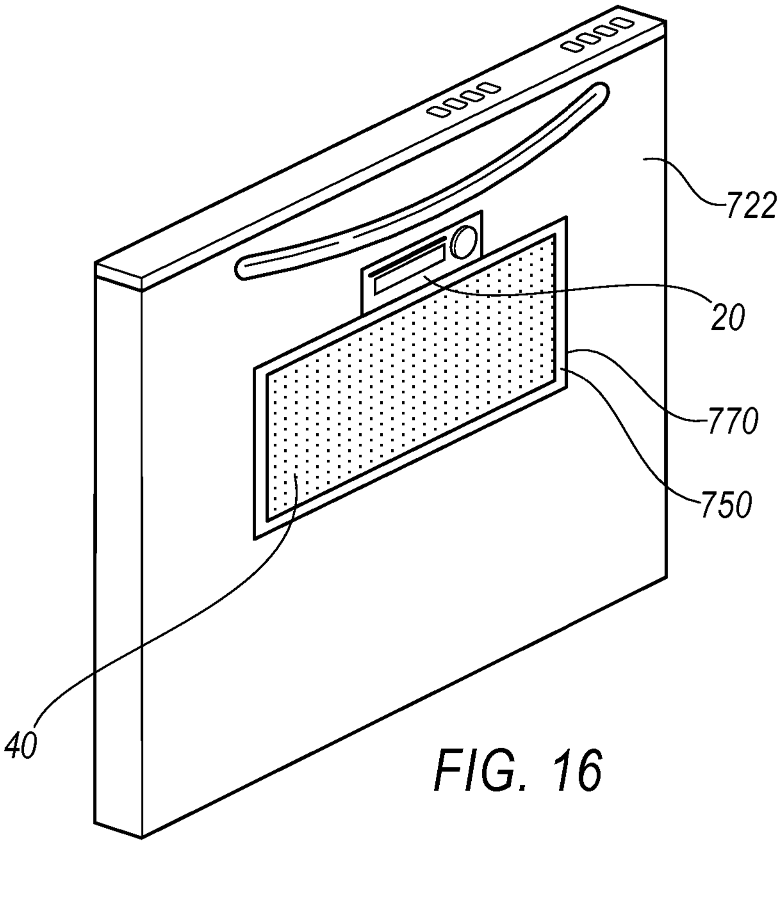
FIG. 16 is a front elevational view of a dishwasher appliance having the consumer electronic device and a speaker mounted in a door of the dishwasher appliance.

While the preceding description references the host appliance as a "host refrigeration appliance 22", it should be appreciated that other appliances can be used to host the consumer electronic device 20, such as appliances that provide heating, cooling, cleaning, drying, refreshing, compressing, cooking, and dispensing. Referring to FIGS. 15 and 16, a host microwave oven 622 and a host dishwasher 722 are shown. As described with respect to the host refrigeration appliance 22, both the microwave and dishwasher hosts 622, 722 include a CED 20 and at least one speaker 40 mounted either directly into a chamber 670, 770 of the host, or alternately, into an adapter 650, 750 that is received into the chamber. Alternately, the CED 20 or the speaker 40 can be located remotely.

It is contemplated that, for all embodiments, the CED 20 can be readily removable and interchangeable. For example, a personal digital music player can be removed from the host 22 (either the adapter 50 or the chamber 70) for use on the person. Then, when the user wants to listen to music in the vicinity of the host appliance 22, the digital music player can be inserted into host. Further, with universal connectors or adapters, different types of CEDs 20 can be interchanged with the host appliance 22. For example, a satellite radio can be interchanged with a digital music player.

For every embodiment of adapter 150, it is contemplated that the docking structure 147 (or receiving structure 134 if the chamber 70 directly receives the CED without an adapter), can be adjustable or reconfigurable to receive different types of CEDs 20 having different shapes or different connectors. Further, the adapter 50 (or chamber 70) can have more than one docking structure 147 (receiving structure 134).

Similarly, it is contemplated that, for all embodiments, the speakers 40 can be readily removable and interchangeable. Further, the speaker 40 can be used remotely from the host 22. It is also envisioned that additional speakers 40 can be used in conjunction with the speaker associated with the host appliance 22, such as on an extended network.

In addition, for all embodiments it is contemplated that any known type of audio/data connection can be used. The connections include, but are not limited to an analog wired connection, a digital wired network, a wireless data connection via a digital wired network, or an analog data connection. It is envisioned that voltage adapters that change AC to DC current, or to step down the DC current can be used. Further, power limiting techniques can be employed to regulate the power to the CED 20.

In all embodiments with a speaker 40 mounted into either the chamber 70 of the host or the compartment 154 in the adapter 150 (adapter chamber), the chamber/compartment 154 is configured for enhancing audio quality generated by the speaker. In the chambers, the speaker 40 and its associated pressure fluctuations are preferably separated from the CED 20 to maintain a stable environment for the CED, and preferably separated from the host appliance 50 to provide a robust acoustic environment for the speaker 40. Additionally, the chamber/compartments 70, 154 preferably prevent or minimize heat exchange between the host appliance 22 and the CED 20 and/or the speaker 40.

It is contemplated that the acoustic chambers/compartments 70, 154 can be designed specifically for each speaker 40. The configuration of each chamber/compartment 70, 154 is preferably designed to take into account the power, size, and frequency of the speaker 40. It is envisioned that the speaker 40 can be enclosed or open to ambient air. It is contemplated that the chamber 70, 154 can be made of plastic, such as styrene.

Various features of a host appliance 22 having a consumer electronic device 20 and/or speakers 40 have been described which may be incorporated singly or in various combinations into a desired system.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

The invention claimed is:

1. An adapter for an appliance performing a useful cycle of operation on an object unrelated to the delivery of sound media, the appliance having a door with an exterior surface and a compartment in the door and open at the exterior surface, the compartment having a receiving structure, said adapter comprising:

a body insertable into the compartment and having a mating structure to be received by the receiving structure of the compartment, and at least one acoustic chamber formed in said body and having an opening, wherein when said body is received in the compartment, said at least one acoustic chamber is substantially enclosed except at said opening located adjacent the exterior surface of the door, said at least one acoustic chamber being configured to at least partially receive at least one device selected from a consumer electronic device and a speaker.

2. The adapter of claim 1 wherein said at least one acoustic chamber includes a docking interface configured to receive a mating interface of the at least one device.

3. The adapter of claim 1 wherein said at least one acoustic chamber is configured to at least partially receive a speaker.

4. The adapter of claim 3 further comprising a network port capable of being connected to the speaker whereby the speaker may be accessed by a network to deliver sound.

5. The adapter of claim 3 further comprising a wireless receiver capable of being connected to the speaker to permit wireless access to the speaker.

6. The adapter of claim 1 wherein said at least one acoustic chamber includes a docking interface configured to receive a mating interface of the at least one device.

7. The adapter of claim 1 wherein said at least one acoustic chamber comprises a first chamber configured to at least partially receive a consumer electronic device, and a second chamber configured to at least partially receive at least one speaker.

8. The adapter of claim 1 wherein the at least one acoustic chamber is sealingly separated from an interior surface of the door.

9. The adapter of claim 8 wherein the at least one acoustic chamber is sealingly separated from the interior surface of the door by an insulation material.

10. The adapter of claim 1 wherein the body includes data connections to communicate data with said at least one device.

11. The adapter of claim 1 wherein the at least one acoustic chamber provides an enhanced acoustical functionality.

12. The adapter of claim 1 wherein the enhanced acoustical functionality is selected from amplification, tuned frequency response, and sound directionality.

13. The adapter of claim 1 wherein the at least one acoustic chamber is capable of interchangeably receiving a plurality of different consumer electronic devices.

14. An adapter for coupling to an appliance performing a useful cycle of operation on an object unrelated to the delivery of sound media, the appliance having a cabinet and a door, the appliance providing mechanical support and at least one electrical service, the adapter comprising:

a main body capable of coupling to the door of the appliance;

a substantially enclosed acoustic chamber formed in the main body and adapted to provide enhanced acoustical functionality and capable of at least partially receiving at least one speaker; and a speaker interface capable of coupling with a speaker when the speaker is at least partially received in the acoustic chamber.

15. The adapter of claim 14 further comprising a speaker at least partially received in the acoustic chamber and coupled with the speaker interface.

16. The adapter of claim 14 wherein the at least one acoustic chamber provides an enhanced acoustical functionality selected from amplification, tuned frequency response, and sound directionality.

17. The adapter of claim 14 wherein said acoustic chamber includes a docking interface configured to receive a mating interface of a speaker.

18. The adapter of claim 14 further comprising a network port capable of being connected to a speaker whereby the speaker may be accessed by a network to deliver sound.

19. The adapter of claim 14 further comprising a wireless receiver capable of being connected to a speaker to permit wireless access to the speaker.

20. The adapter of claim 14 wherein main body further comprises a second chamber configured to receive a consumer electronic device.

21. The adapter of claim 20 wherein said second chamber includes a docking interface configured to receive a mating interface of a consumer electronic device.

22. The adapter of claim 14 wherein said main body includes data connections to transfer data from said consumer electronic device.

23. The adapter of claim 14 further comprising a device interface capable of coupling with a consumer electronic device and connecting the consumer electronic device to the speaker interface.

24. The adapter of claim 23, wherein the device interface is configured to alternatively couple with a plurality of different consumer electronic devices.

25. The adapter of claim 14 further comprising a docking port configured to receive a consumer electronic devices and couple the consumer electronic device to the speaker interface.

26. The adapter of claim 25, wherein the docking port is configured to alternatively receive a plurality of different consumer electronic devices.

27. An adapter for coupling to an appliance performing a useful cycle of operation on an object unrelated to the delivery of sound media, the appliance having a cabinet and a door, the appliance providing mechanical support and at least one electrical service, the adapter comprising:

a main body adapted to couple to the door of the appliance;

a first chamber formed in the main body and adapted to receive at least one speaker and provide enhanced acoustical functionality;

a second chamber formed in the main body and adapted to receive at least one consumer electronic device; and connections extending between the first and second chambers and coupling the consumer electronic device to the speaker when the consumer electronic device is received within the second chamber to transfer audio from the consumer electronic device to the speaker.

28. The adapter of claim 27 wherein the enhanced acoustical functionality selected from amplification, tuned frequency response, and sound directionality.

29. The adapter of claim 28 wherein the adapter further comprises at least one of a docking interface configured to receive a mating interface of the speaker; a network port capable of being connected to a speaker whereby the speaker may be accessed by a network to deliver sound; a wireless receiver capable of being connected to a speaker to permit wireless access to the speaker; and data connections to transfer data from said consumer electronic device.

30. The adapter of claim 27 further comprising a speaker mounted in the first chamber.

* * * * *